United States Patent
Kao

(10) Patent No.: US 7,679,984 B2
(45) Date of Patent: Mar. 16, 2010

(54) CONFIGURABLE MEMORY DATA PATH

(75) Inventor: Rom-Shen Kao, Durham, NC (US)

(73) Assignee: Qimonda North Amercia Corp., Cary, NC (US)

( * ) Notice: Subject to any disclaimer, the term of this patent is extended or adjusted under 35 U.S.C. 154(b) by 387 days.

(21) Appl. No.: 11/695,676

(22) Filed: Apr. 3, 2007

(65) Prior Publication Data

US 2008/0247259 A1 Oct. 9, 2008

(51) Int. Cl.
*G11C 8/00* (2006.01)

(52) U.S. Cl. .................. 365/230.06; 365/189.011; 365/230.01

(58) Field of Classification Search ............ 365/63, 365/77, 189.01, 230.06, 230.08; 711/100, 711/105

See application file for complete search history.

(56) References Cited

U.S. PATENT DOCUMENTS

| | | | |
|---|---|---|---|
| 6,304,497 B1 | 10/2001 | Roohparvar | |
| 6,434,035 B2 * | 8/2002 | Miersch et al. | 365/63 |
| 6,691,214 B1 * | 2/2004 | Li et al. | 711/167 |
| 6,785,765 B1 | 8/2004 | Roohparvar | |
| 7,111,108 B2 * | 9/2006 | Grundy et al. | 711/100 |
| 2002/0018375 A1 * | 2/2002 | Miersch et al. | 365/200 |
| 2004/0236894 A1 * | 11/2004 | Grundy et al. | 711/1 |

OTHER PUBLICATIONS

Specification Sheet for QM28F016S5. "16 Mbit (x8) Even-Sectored Flash Memory." Quadrant Components, Inc.
Specification Sheet for MT28F008B5 and MT28F800B5. "8Mb Smart 5 Boot Block Flash Memory." Micron Technology, Inc.

* cited by examiner

*Primary Examiner*—Gene N. Auduong
(74) *Attorney, Agent, or Firm*—Coats & Bennett, P.L.L.C.

(57) ABSTRACT

A data path in a memory device is configured by selecting a data path configuration configured to at least partially maintain data bit order between the memory device and a chip carrier. The memory data path is arranged based on the data path configuration for memory operations where maintaining data bit order between the memory device and the chip carrier is required.

27 Claims, 6 Drawing Sheets

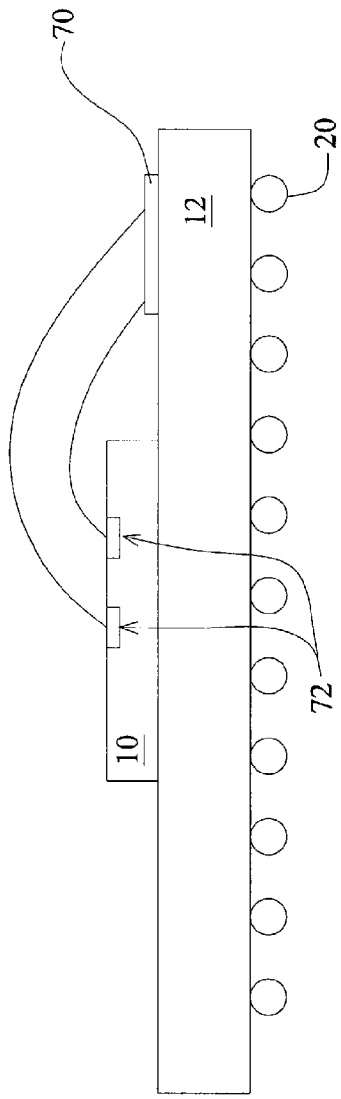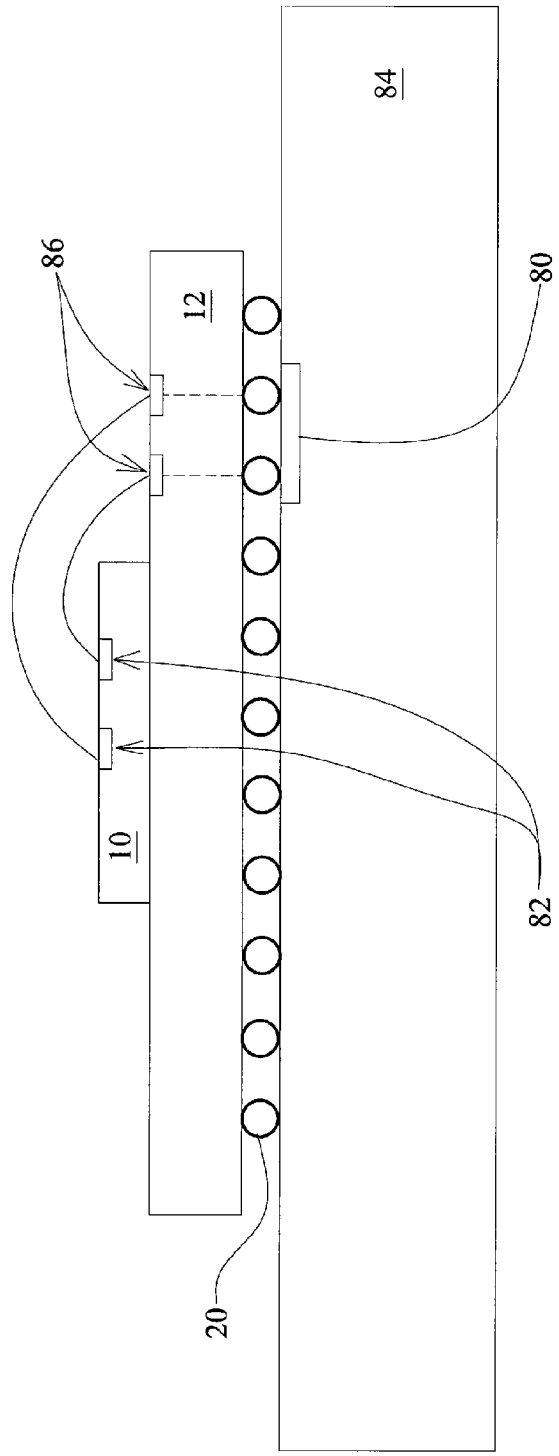

CONFIGURABLE MEMORY DATA PATH

BACKGROUND OF THE INVENTION

Maintaining data bit order between a memory device such as a dynamic random access memory (DRAM), static random access memory (SRAM) or Flash device and the package to which the memory device is mounted has been irrelevant until recently. That is, the ordering of data within a memory device may be different from the order in which the data is read from or written to the package without compromising data integrity. For example, the most significant data bit at the package may not correspond to the most significant data bit at the DRAM device and vice-versa. As such, data bit order between a memory device and package is conventionally lost during memory operations such as reads and writes. The data input/output (I/O) layout or 'footprint' of a memory device may be selected independent of the data I/O layout of a package when data bit order is not required, thus allowing independent optimization of memory and package data I/O layouts.

Some new types of memory operations require data bit order to be preserved as data propagates between a package and memory device. One such memory operation is a DRAM register readout operation. During a register readout operation, data is read from a register included in a DRAM device and propagates through a package to another device for analysis. The register contains one or more parameters of interest written into the register by the DRAM device. The state of each parameter is indicated by one or more particular register bits. Accordingly, data bit order must be preserved as data propagates between a package and DRAM device during a register readout memory operation. Otherwise, information read from the register is useless.

One type of register readout memory operation is the status register read (SRR) method proposed by the JEDEC Solid State Technology Association (ballot number JC-42.3-05-357). During an SRR operation, one or more registers in a DRAM device are read. The proposed SRR register is at least 16 bits in width. SRR bits <3:0> indicate device ID, bits <7:4> indicate manufacturer's revision number, bits <10:8> indicate refresh rate, bit <11> indicates device width, bit <12> indicates device type, and bits <15:13> indicate device density. Accordingly, data bit order must be maintained between a DRAM device and package during an SRR memory operation. That is, the $n^{th}$ bit read from the SRR register must correspond to the $n^{th}$ data bit at the package, the n-1 SRR register bit must correspond to the n-1 package data bit, etc.

DRAM-to-package data bit ordering is conventionally forced upon the package. That is, the package data I/O layout must mate with the DRAM data I/O layout in a manner that maintains data bit order between the package and DRAM device. Electrical performance of the package is degraded and cost increases when data bit ordering constraints are placed on the package. For example, many signals may undesirably cross paths in the package, resulting in noise. Wiring traces may be longer than otherwise necessary when data bit ordering is a concern. Additional substrate levels may be required if data bit ordering cannot be maintained using fewer levels.

DRAM-to-package data bit ordering requirements become more difficult to accommodate in light of the various types of packages available for use with DRAM devices. For example, JEDEC specifies numerous types of DRAM packages such as multi-chip package (MCP), package-on-package (PoP), ball grid array (BGA), etc. Each package type has a different data I/O layout. That is, the $m^{th}$ data bit for a PoP package is not located at the same x-y coordinate as the $m^{th}$ data bit for an MCP package. Thus, a DRAM device that supports memory operations where data bit order is required must account for the data I/O layout of each type of package for which the DRAM device is compatible. Otherwise, DRAM-to-package data bit ordering requirements are forced upon each of the different package types.

SUMMARY OF THE INVENTION

According to the methods and apparatus taught herein, a data path in a memory device is configured by selecting a data path configuration configured to at least partially maintain data bit order between the memory device and a chip carrier. The memory data path is arranged based on the data path configuration for memory operations where maintaining data bit order between the memory device and the chip carrier is required.

Of course, the present invention is not limited to the above features and advantages. Those skilled in the art will recognize additional features and advantages upon reading the following detailed description, and upon viewing the accompanying drawings.

BRIEF DESCRIPTION OF THE DRAWINGS

FIG. 7 is a cross-sectional view of a chip carrier including yet another embodiment of circuitry configured to identify a data path configuration for a memory device.

FIG. 8 is a cross-sectional view of a printed circuit board including still another embodiment of circuitry configured to identify a data path configuration for a memory device.

DETAILED DESCRIPTION OF THE INVENTION

Figure 1:
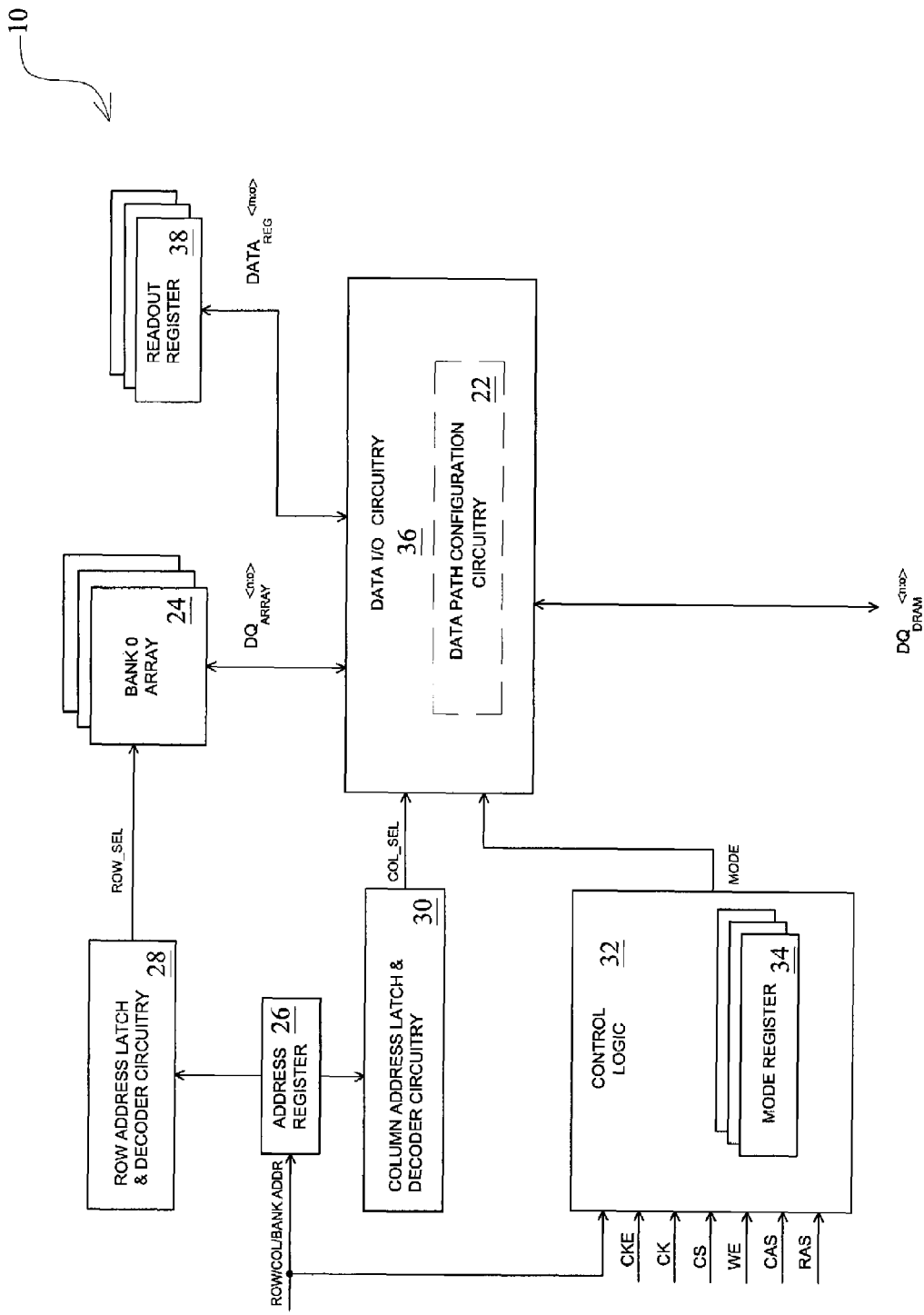
FIG. 1 is a block diagram of an embodiment of a memory device including data path configuration circuitry.
Figure 2:
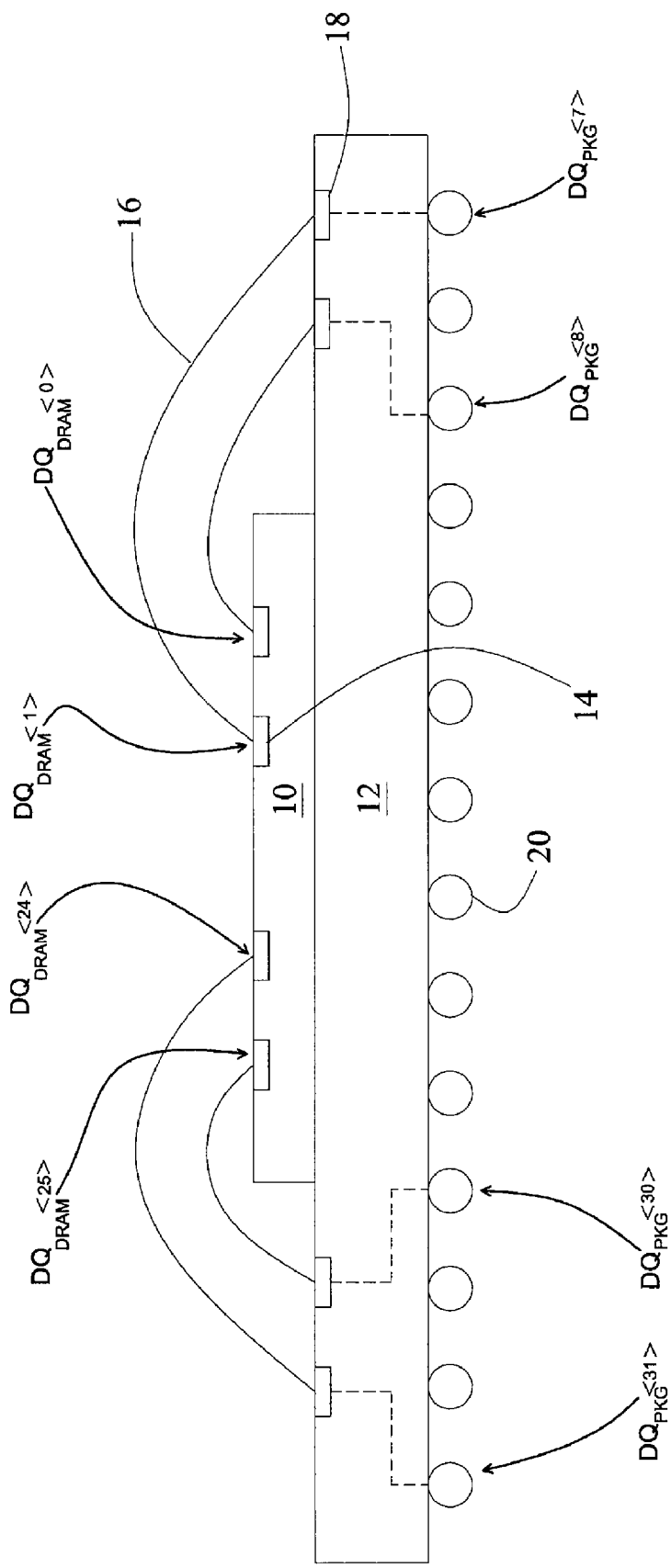
FIG. 2 is a cross-sectional view of the memory device of FIG. 1 mounted on a chip carrier.

FIG. 1 illustrates an embodiment of a memory device 10. FIG. 2 is a cross-sectional illustration of an embodiment of the memory device 10 mounted to an exemplary chip carrier 12. The memory device 10 may comprise volatile or non-volatile semiconductor memory such as SRAM, Flash or DRAM such as Synchronous DRAM (SDRAM), Double Data Rate (DDR) SDRAM, Quad Data Rate (QDR) SDRAM, Synchronous Graphics DRAM or the like. For ease of explanation only, operation of the memory device 10 is explained herein with reference to DRAM semiconductor memory. However, those skilled in the art will readily recognize that the embodiments disclosed herein are semiconductor memory technology independent. Thus, the present embodiments are not in any way limited to a particular semiconductor memory technology. With this understanding, the DRAM device 10 is configurable to resolve data bit order mismatches between the DRAM device 10 and chip carrier 12 for memory operations where maintaining data bit order is required, i.e., memory operations where the resulting information is unusable unless data bit order is maintained between the DRAM device 10 and chip carrier 12. Operation of the DRAM device 10 is described next with reference to FIGS. 1 and 2.

The chip carrier 12 of FIG. 2 may be temporary or permanent. A temporary chip carrier couples the DRAM device 10 to a higher-level assembly (not shown) during test or other manufacturing procedure such as burn-in. A permanent chip carrier such as a PoP, MCP or BGA package or the like permanently couples the DRAM device 10 to a higher-level assembly such as a printed circuit board. The DRAM device 10 has terminal pads 14 for signal coupling to the chip carrier 12. A subset of the DRAM terminal pads 14 form a DRAM data bus $DQ_{DRAM}<n:0>$ which is the main bus for transferring data into and out of the DRAM device 10. In FIG. 2, the DRAM terminal pads 14 are electrically coupled via wire bonds 16 to terminal pads 18 included in the chip carrier 12. However, any suitable connection medium may be used to link the DRAM device 10 to the chip carrier 12 such as solder, columns, pins, optics, pressure contacts, etc.

The chip carrier 12 also has external electrical contacts 20 shown as balls in FIG. 2 for signal coupling the chip carrier 12 to a higher-level assembly such as a printed circuit board (not shown). Of course, any other suitable connection medium may be used to link the chip carrier 12 to a higher-level assembly. A subset of the chip carrier's electrical contacts 20 form a chip carrier data bus $DQ_{PKG}<n:0>$ used to transfer data between the chip carrier 12 and higher-level assembly. The chip carrier data bus $DQ_{PKG}<n:0>$ and main DRAM data bus $DQ_{DRAM}<n:0>$ do not have the same bit order. For example, in FIG. 2, $DQ_{PKG}<31>$ is coupled to $DQ_{DRAM}<24>$, $DQ_{PKG}<30>$ is coupled to $DQ_{DRAM}<25>$, $DQ_{PKG}<8>$ is coupled to $DQ_{DRAM}<0>$, $DQ_{PKG}<7>$ is coupled to $DQ_{DRAM}<1>$, etc.

The DRAM device 10 includes data path configuration circuitry 22 for arranging the DRAM data path so that data bit order mismatches between the DRAM device 10 and chip carrier 12 are resolved for memory operations where maintaining data bit order is required. As used herein, DRAM data path means the path via which data travels in the DRAM device 10. The data path configuration circuitry 22 arranges the DRAM data path so that data bit order is at least partially maintained between $DQ_{PKG}<n:0>$ and $DQ_{DRAM}<n:0>$.

The DRAM data path is configured differently for memory operations where maintaining data bit order is not required, i.e., for memory operations where the resulting information is useful even though data bit order is not maintained between $DQ_{PKG}<n:0>$ and $DQ_{DRAM}<n:0>$. For example, the DRAM data path may be configured one way for register readout operations and a different way for memory array read and write operations. Further, the data path configuration circuitry 22 can arrange the DRAM data path based on the data input/output (I/O) configuration of various chip carrier types as will be described in more detail later. This way, the DRAM device 10 may be data bit order compatible with different chip carrier types.

In more detail, the DRAM device 10 includes a memory array 24 arranged as one or more banks for storing data. Row, column and bank address information (ROW/COUBANK ADDR) is provided to the DRAM device 10 and stored in an address register 26. The address information indicates which row and column location in the memory array 24 is to be accessed during an array read or write operation (and bank if the memory array is so arranged). Row address latch and decoder circuitry 28 determines which row in the memory array 24 is selected (row_sel) during a memory operation based on row address information provided by the address register 26. Likewise, column address latch and decoder circuitry 30 determines which columns in the memory array 24 are selected (col_sel).

Control logic 32 included in the DRAM device 10 manages overall operation of the device 10 responsive to a clock enable signal (CKE), clock signal (CK), chip select signal (CS), write enable signal (WE), row address strobe signal (RAS), column address strobe signal (CAS) and the address signals, as is well known in the art. The control logic 32 includes one or more mode registers 34 for storing the current operating mode settings of the DRAM device 10. The control logic 32 also indicates to the data path configuration circuitry 22 whether data bit order should be maintained for a particular memory operation via a signal (MODE). In one embodiment, the control logic 32 monitors the various control and address signals to identify memory operations where data bit order is required. The control logic 32 activates the MODE signal upon detection of such a memory operation, e.g., a register readout operation. In response, the data path configuration circuitry 22 arranges the DRAM data path so that data bit order between the DRAM device 10 and chip carrier 12 is at least partially maintained during the memory operation. Otherwise, the data path configuration circuitry 22 arranges the DRAM data path according to a different configuration.

The data path configuration circuitry 22 is included in or associated with data I/O circuitry 36 included in the DRAM device 10. The data I/O circuitry 36 is coupled to the memory array 24 via a memory array bus $DQ_{ARRAY}<n:0>$ and controls the flow of data into and out of the memory array 24. The data I/O circuitry 36 may include masking logic, gating logic, write drivers, sense amplifiers, latches, and the like for managing memory array data flow. In one embodiment, the data path configuration circuitry 22 couples the main DRAM data bus $DQ_{DRAM}<n:0>$ to the memory array bus $DQ_{ARRAY}<n:0>$ via the data I/O circuitry 36 when the control logic 32 indicates maintenance of data bit order is not required. This way, data propagates between the memory array 24 and DRAM terminal pads 14 via the memory array bus $DQ_{ARRAY}<n:0>$ and main DRAM data bus $DQ_{DRAM}<n:0>$.

The data path configuration circuitry 22 reconfigures the DRAM data path when the control logic 32 indicates maintenance of data bit order is required. In response, the data path configuration circuitry 22 reconfigures the DRAM data path so that the data bit order of the main DRAM data bus $DQ_{DRAM}<n:0>$ at least partially matches the data bit order of the chip carrier data bus $DQ_{PKG}<n:0>$. In one embodiment, the data path configuration circuitry 22 couples the main DRAM data bus $DQ_{DRAM}<n:0>$ to a different internal bus when the control logic 32 indicates maintenance of data bit order is required. According to this embodiment, the data path configuration circuitry 22 couples the main DRAM data bus $DQ_{DRAM}<n:0>$ to a register data bus $DQ_{REG}<m:0>$ during register readout memory operations. The register data bus $DQ_{REG}<m:0>$ transfers data to and from one or more readout registers 38 included in the DRAM device 10 during a register readout operation.

The width of the readout register 38 may not match the width of the main DRAM data bus (i.e., m≠n). For example, the readout register 38 may have a width of 16 bits while the main DRAM data bus has a width of 32 bits. In this example, data bit order is required only for the 16 bits of the main DRAM data bus coupled to the register bus. During a register readout operation, each bit of the register data bus $DQ_{REG}<m:0>$ is mapped to a corresponding bit of the main DRAM data bus $DQ_{DRAM}<n:0>$ such that the bit order of the readout register 38 is preserved at the chip carrier data bus $DQ_{PKG}$<n:0>. For example, based on FIG. 2, the data path configuration circuitry 22 couples $DQ_{REG}$<8> to $DQ_{DRAM}$<0>, $DQ_{REG}$<7> to $DQ_{DRAM}$<1>, etc. This way, data bit order is maintained between the readout register 38 and chip carrier 12 because $DQ_{REG}$<8> is coupled to $DQ_{PKG}$<8>, $DQ_{REG}$<7> is coupled to $DQ_{PKG}$<7>, etc. Alternatively, the data path configuration circuitry 22 may rearrange how the memory array bus $DQ_{ARRAY}$<n:0> is coupled to the main DRAM data bus $DQ_{DRAM}$<n:0>. Either way, the data path configuration circuitry 22 arranges the DRAM data path so that data bit order is maintained between the DRAM device 10 and chip carrier 12 for memory operations where data bit order is required.

Figure 3:
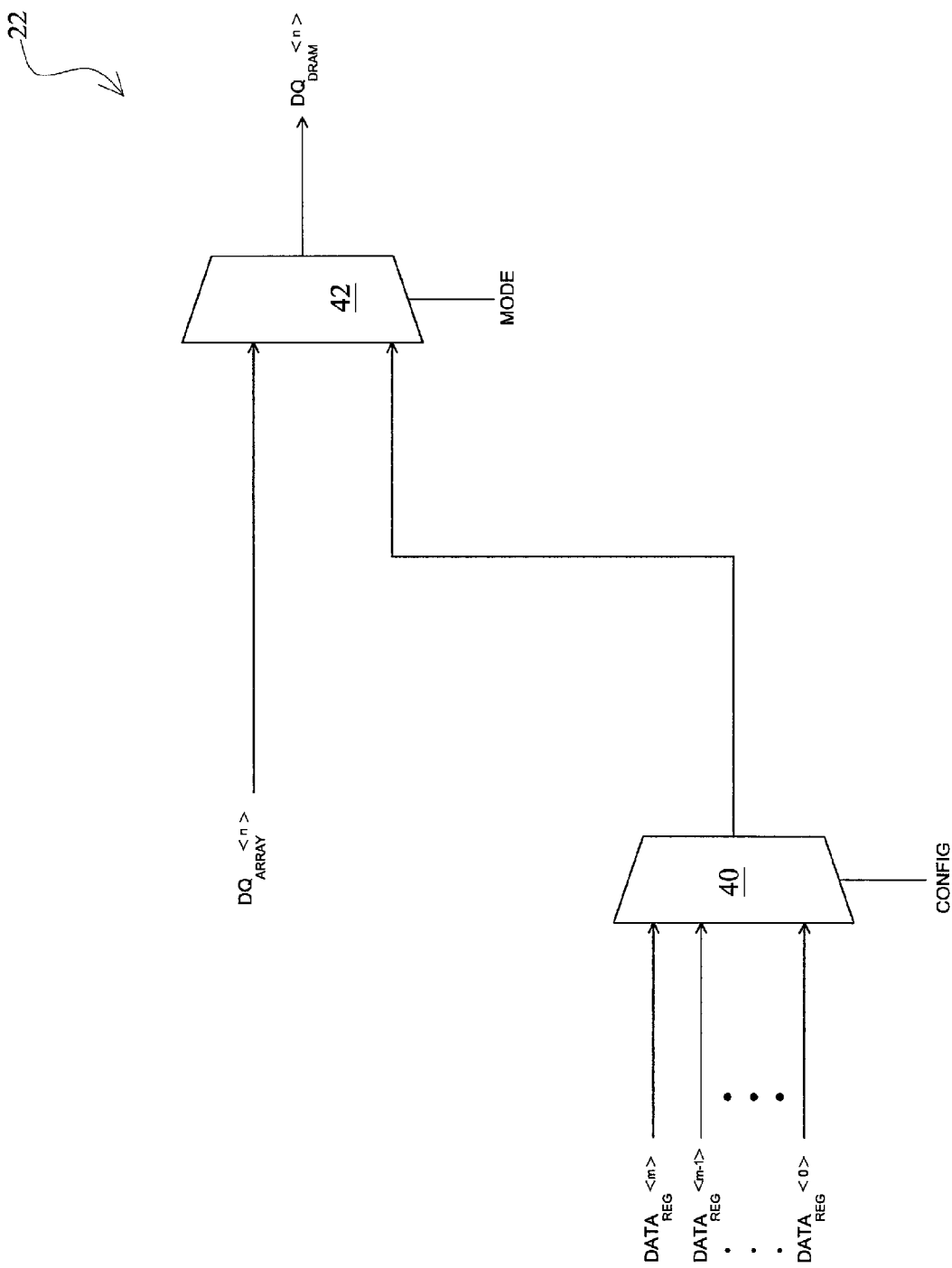
FIG. 3 is a block diagram of an embodiment of the data path configuration circuitry of FIG. 1.

FIG. 3 illustrates an embodiment of the data path configuration circuitry 22 for the $n^{th}$ bit of the main DRAM data bus $DQ_{DRAM}$<n:0>. According to this embodiment, the data path configuration circuitry 22 comprises two multiplexer circuits 40, 42. The first multiplexer circuit 40 selects a data path configuration for $DQ_{DRAM}$<n> that will maintain data bit order between the DRAM device 10 and chip carrier 12, e.g., as illustrated by Block 100 of FIG. 4. Multiple DRAM data path configurations are available so that different chip carrier data I/O organizations may be accommodated. In the present embodiment, any one of the readout register bits $DQ_{REG}$<m:0> may be selected based on the configuration select signal (CONFIG). However, fewer configurations may be available, e.g., only a subset of the register bits may be available for selection. Preferably, the number of DRAM data path configuration options corresponds to the number of different chip carrier types supported by the DRAM device 10. For example, if the DRAM device 10 is compatible with six different chip carrier types, there are preferably six different DRAM data path configurations to choose.

Figure 4:
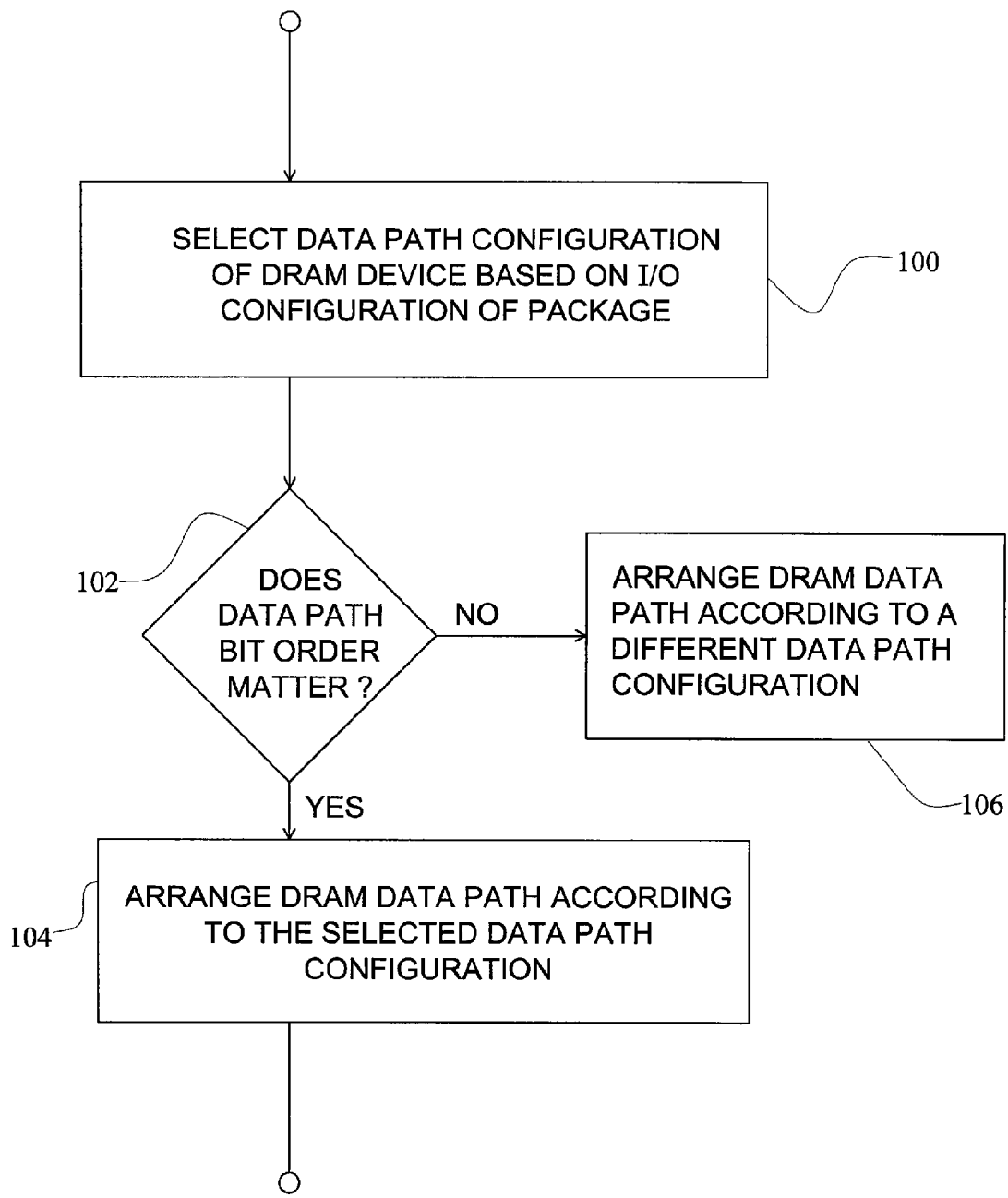
FIG. 4 is a logic flow diagram of an embodiment of program logic for arranging a data path of a memory device.

The control logic 32 determines whether maintaining data bit order is required for a particular memory operation, e.g., as illustrated by Block 102 of FIG. 4. If data bit order is required, the second multiplexer 42 arranges the DRAM data path based on the selected data path configuration, e.g., as illustrated by Block 104 of FIG. 4. That is, the second multiplexer 42 couples $DQ_{DRAM}$<n> to the output of the first multiplexer 40. This way, the appropriate register bit for maintaining data bit order between the DRAM device 10 and chip carrier 12 is coupled to $DQ_{DRAM}$<n>. Otherwise, the second multiplexer 42 couples $DQ_{DRAM}$<n> to the $n^{th}$ bit of the memory array bus $DQ_{ARRAY}$<n:0>, e.g., as illustrated by Block 106 of FIG. 4. Collectively then, the data path configuration circuitry 22 arranges each bit of the register bus $DQ_{REG}$<m:0> based on the configuration select signal (CONFIG).

Figure 5:
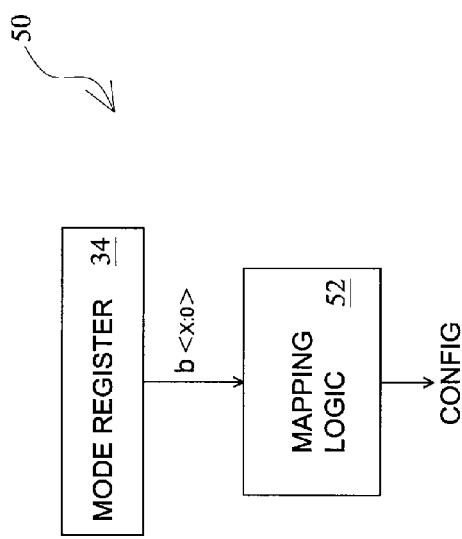
FIG. 5 is a block diagram of one embodiment of circuitry configured to identify a data path configuration for a memory device.

FIG. 5 illustrates one embodiment of circuitry 50 for determining the state of the configuration select signal (CONFIG). The circuitry 50 determines the state of the configuration select signal (CONFIG) based on a control signal b<x:0> provided to the DRAM device 10. The state of the control signal corresponds to the data I/O configuration of a particular chip carrier type. That is, the state of b<x:0> indicates how the DRAM data path should be configured to maintain bit order given a particular chip carrier data I/O configuration. This way, multiple chip carrier types may be supported by the DRAM device 10. The number of different data I/O chip carrier configurations supported corresponds to $2^n$ where n is the number of control bits.

The control signal b<x:0> is stored in one of the mode registers 34 included in the control logic 32 of the DRAM device 10. Each bit of the control signal may be programmed during a mode register select operation. One or more reserved bits in the mode register 34 may be used to store the control bit information. Alternatively, one or more additional bits may be added to the mode register 34 for storing b<x:0>. Regardless, the mode register 34 provides b<x:0> to mapping logic 52. The mapping logic 52 programs the configuration select signal (CONFIG) based on the state of the control bits, e.g., as illustrated in Table 1 below. Table 1 provides an exemplary illustration as to how one of six different DRAM data path configurations may be selected based on the state of three control signal bits b<2:0>. Particularly, each state of the control signal corresponds to a different DRAM data path configuration as represented by the configuration select signal (CONFIG). For example, a default data path configuration is selected when b<2:0>=<0,0,0>. A second data path configuration is selected when b<2:0>=<0,0,1> and so on.

TABLE 1

Exemplary Data Path Configurations

| Control Bits | | | |
|---|---|---|---|
| b2 | b1 | b0 | CONFIG |
| 0 | 0 | 0 | configuration 1 |
| 0 | 0 | 1 | configuration 2 |
| 0 | 1 | 0 | configuration 3 |
| 0 | 1 | 1 | configuration 4 |
| 1 | 0 | 0 | configuration 5 |
| 1 | 0 | 1 | configuration 6 |
| 1 | 1 | 0 | n/a |
| 1 | 1 | 1 | n/a |

Table 2 below provides an exemplary illustration as to how the data path configuration circuitry 22 arranges the DRAM data path based on the six configuration states identified in Table 1. Particularly, Table 2 illustrates how the first 8 bits of the register data bus $DQ_{REG}$<m:0> are coupled to the main DRAM data bus $DQ_{DRAM}$<n:0> based on the state of CONFIG. When CONFIG=1, data bit order is maintained between the register data bus and main DRAM data bus. That is, $DQ_{REG}$<7> is coupled to $DQ_{DRAM}$<7>, $DQ_{REG}$<6> is coupled to $DQ_{DRAM}$<6>, etc. When CONFIG=2, the data bit order between the register data bus and main DRAM data bus is shifted by one byte. That is, $DQ_{REG}$<7> is coupled to $DQ_{DRAM}$<15>, $DQ_{REG}$<6> is coupled to $DQ_{DRAM}$<14>, etc. Similarly, data bit order is shifted by another byte when CONFIG=3. When CONFIG=4, bit order between the register data bus and main DRAM data bus is flipped. That is, $DQ_{REG}$<7> is coupled to $DQ_{DRAM}$<8>, $DQ_{REG}$<6> is coupled to $DQ_{DRAM}$<9>, etc. The data bit order between the register data bus and main DRAM data bus is flipped and shifted by one byte when CONFIG=5. That is, $DQ_{REG}$<7> is coupled to $DQ_{DRAM}$<16>, $DQ_{REG}$<6> is coupled to $DQ_{DRAM}$<17>, etc. Similarly, the data bit order is flipped and shifted by another byte when CONFIG=6. The data path configuration circuitry 22 arranges the DRAM data path using a sliding window approach according to this embodiment. Broadly, the data path configuration circuitry 22 arranges the DRAM data path based on the data I/O configuration of any chip carrier type supported by the DRAM device 10.

TABLE 2

Exemplary Readout Register to Data Path Bit Mapping

| CONFIG | $DATA_{REG}<7>$ | $DATA_{REG}<6>$ | $DATA_{REG}<5>$ | $DATA_{REG}<4>$ | $DATA_{REG}<3>$ | $DATA_{REG}<2>$ | $DATA_{REG}<1>$ | $DATA_{REG}<0>$ |
|---|---|---|---|---|---|---|---|---|
| 1 | $DQ_{DRAM}<7>$ | $DQ_{DRAM}<6>$ | $DQ_{DRAM}<5>$ | $DQ_{DRAM}<4>$ | $DQ_{DRAM}<3>$ | $DQ_{DRAM}<2>$ | $DQ_{DRAM}<1>$ | $DQ_{DRAM}<0>$ |
| 2 | $DQ_{DRAM}<15>$ | $DQ_{DRAM}<14>$ | $DQ_{DRAM}<13>$ | $DQ_{DRAM}<12>$ | $DQ_{DRAM}<11>$ | $DQ_{DRAM}<10>$ | $DQ_{DRAM}<9>$ | $DQ_{DRAM}<8>$ |
| 3 | $DQ_{DRAM}<23>$ | $DQ_{DRAM}<22>$ | $DQ_{DRAM}<21>$ | $DQ_{DRAM}<20>$ | $DQ_{DRAM}<19>$ | $DQ_{DRAM}<18>$ | $DQ_{DRAM}<17>$ | $DQ_{DRAM}<16>$ |
| 4 | $DQ_{DRAM}<8>$ | $DQ_{DRAM}<9>$ | $DQ_{DRAM}<10>$ | $DQ_{DRAM}<11>$ | $DQ_{DRAM}<12>$ | $DQ_{DRAM}<13>$ | $DQ_{DRAM}<14>$ | $DQ_{DRAM}<15>$ |
| 5 | $DQ_{DRAM}<16>$ | $DQ_{DRAM}<17>$ | $DQ_{DRAM}<18>$ | $DQ_{DRAM}<19>$ | $DQ_{DRAM}<20>$ | $DQ_{DRAM}<21>$ | $DQ_{DRAM}<22>$ | $DQ_{DRAM}<23>$ |
| 6 | $DQ_{DRAM}<24>$ | $DQ_{DRAM}<25>$ | $DQ_{DRAM}<26>$ | $DQ_{DRAM}<27>$ | $DQ_{DRAM}<28>$ | $DQ_{DRAM}<29>$ | $DQ_{DRAM}<30>$ | $DQ_{DRAM}<31>$ |

Figure 6:
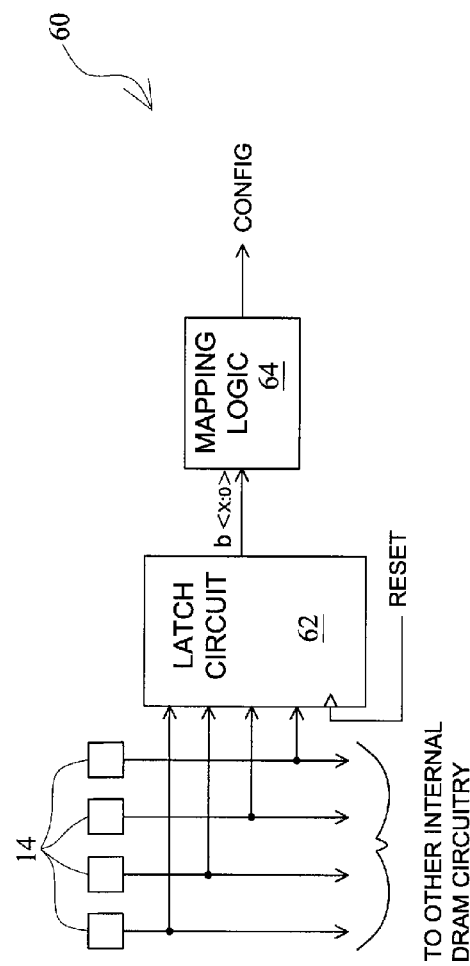
FIG. 6 is a block diagram of another embodiment of circuitry configured to identify a data path configuration for a memory device.

FIG. 6 illustrates another embodiment of circuitry 60 for determining the state of the configuration select signal (CONFIG) based on the control signal b<x:0>. According to this embodiment, the state of the control signal b<x:0> is sensed at corresponding ones of the DRAM terminal pads 14. Particularly, the voltage level at the one or more terminal pads 14 corresponds to the state of b<x:0>. The circuitry 60 includes latch circuitry 62 for sensing and capturing the control signal voltage levels when the terminal pads 14 are not otherwise utilized. That is, the terminal pads 14 may carry data, address or control signals during normal DRAM operation and indicate the state of b<x:0> during reset of the DRAM device 10. Accordingly, the latch circuit 62 senses and captures voltage levels responsive to a DRAM reset signal (RESET). This way, the state of b<x:0> is captured during reset without interfering with normal DRAM operation. The latch circuitry 62 provides b<x:0> to mapping logic 64. The mapping logic 64 programs the configuration select signal (CONFIG) based on the state of b<x:0>, e.g., as illustrated in Table 1 above.

FIG. 7 illustrates yet another embodiment of circuitry 70 for determining the state of the configuration select signal (CONFIG) based on the control signal b<x:0>. According to this embodiment, one or more of the DRAM terminal pads 14 are dedicated pads 72. The dedicated terminal pads 72 indicate the state of the control signal b<x:0> and have no other function during normal DRAM operation. Thus, the state of b<x:0> may be sensed during reset or normal DRAM operation based on the voltage level at the dedicated terminal pads 72. The circuitry 70 comprises pull-up/pull-down circuitry included in the chip carrier 12. The pull-up/pull-down circuitry 70 programs the voltage level at the dedicated terminal pads 72 for indicating the state of b<x:0>. The configuration select signal (CONFIG) is programmed based on the voltage levels sensed at the dedicated terminal pads 72.

FIG. 8 illustrates still another embodiment of circuitry 80 for determining the state of the configuration select signal (CONFIG) based on the control signal b<x:0>. According to this embodiment, one or more of the DRAM terminal pads 14 are also dedicated pads 82. The voltage level at each dedicated terminal pad 82 indicates the state of the control signal b<x:0>. The circuitry 80 comprises pull-up/pull-down circuitry for programming the control signal voltage levels. However, the pull-up/pull-down circuitry 80 is included in a higher-level assembly 84 such as a printed circuit board to which the chip carrier 12 is coupled. Accordingly, one or more additional dedicated terminal pads 86 are included in the chip carrier 12. This way, control signal voltages may be programmed at the higher-level assembly 84 and applied to the DRAM device 10 via the dedicated chip carrier terminal pads 86 and dedicated DRAM terminal pads 82. The configuration select signal (CONFIG) is programmed based on the voltage levels sensed at the dedicated DRAM terminal pads 82.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of configuring a data path in a memory device, comprising:
   selecting one of a first data path configuration configured to at least partially maintain data bit order between the memory device and a chip carrier and a second different data path configuration;
   arranging the memory data path based on the first data path configuration for memory operations where maintaining data bit order between the memory device and the chip carrier is required; and
   arranging the memory data path based on the second data path configuration for memory operations where maintaining data bit order between the memory device and the chip carrier is not required.

2. The method of claim 1, comprising selecting one of the data path configurations based on one or more bits stored in a register.

3. The method of claim 1, comprising selecting one of the data path configurations based on one or more sensed voltage levels.

4. The method of claim 3, comprising:
   storing a voltage level sensed at one or more terminal pads of the memory device during reset of the memory device; and
   selecting one of the data path configurations based on each stored voltage level.

5. The method of claim 3, comprising selecting one of the data path configurations based on a voltage level sensed at one or more terminal pads of the memory device dedicated to indicating the data path configuration.

6. The method of claim 1, wherein arranging the memory data path based on the first data path configuration comprises arranging the memory data path based on the first data path configuration responsive to a register read command issued to the memory device.

7. The method of claim 1, wherein the memory device comprises a dynamic random access memory (DRAM) device.

8. A memory device, comprising circuitry configured to:
   select one of a first data path configuration configured to at least partially maintain data bit order between the memory device and a chip carrier and a second different data path configuration;
   arrange a data path in the memory device based on the first data path configuration for memory operations where maintaining data bit order between the memory device and the chip carrier is required; and arrange the data path in the memory device based on the second data path configuration for memory operations where maintaining data bit order between the memory device and the chip carrier is not required.

9. The memory device of claim 8, wherein the circuitry is configured to select one of the data path configurations based on one or more bits stored in a register.

10. The memory device of claim 8, wherein the circuitry is configured to select one of the data path configurations based on one or more sensed voltage levels.

11. The memory device of claim 10, wherein circuitry is configured to store a voltage level sensed at one or more terminal pads of the memory device during reset of the memory device and select one of the data path configurations based on each stored voltage level.

12. The memory device of claim 10, wherein the circuitry is configured to select one of the data path configurations based on a voltage level sensed at one or more terminal pads of the memory device dedicated to indicating the data path configuration.

13. The memory device of claim 8, wherein the circuitry is configured to arrange the memory data path based on the first data path configuration responsive to a register read command issued to the memory device.

14. The memory device of claim 8, wherein the memory device comprises a dynamic random access memory (DRAM) device.

15. A memory device, comprising:
means for selecting one of a first data path configuration configured to at least partially maintain data bit order between the memory device and a chip carrier and a second different data path configuration; and
means for arranging a data path in the memory device based on the first data path configuration for memory operations where maintaining data bit order between the memory device and the chip carrier is required and arranging the data path in the memory device based on the second data path configuration for memory operations where maintaining data bit order between the memory device and the chip carrier is not required.

16. A method of configuring a data path in a dynamic random access memory (DRAM) device, comprising:
arranging the DRAM data path based on a first data path configuration for memory operations where maintaining data bit order between the DRAM device and a chip carrier is required, the first data path configuration configured to at least partially maintain data bit order between the DRAM device and the chip carrier; and
arranging the DRAM data path based on a different data path configuration for memory operations where maintaining data bit order between the DRAM device and the chip carrier is not required.

17. The method of claim 16, wherein arranging the DRAM data path based on the first data path configuration comprises arranging the DRAM data path based on one or more bits stored in a register.

18. The method of claim 16, wherein arranging the DRAM data path based on the first data path configuration comprises arranging the DRAM data path based on one or more sensed voltage levels.

19. The method of claim 18, wherein arranging the DRAM data path based on one or more sensed voltage levels comprises:
storing a voltage level sensed at one or more terminal pads of the DRAM device during reset of the DRAM device; and
arranging the DRAM data path based on each stored voltage level.

20. The method of claim 18, wherein arranging the DRAM data path based on one or more sensed voltage levels comprises arranging the DRAM data path based on a voltage level sensed at one or more terminal pads of the DRAM device dedicated to indicating the data path configuration.

21. The method of claim 16, wherein arranging the DRAM data path based on the first data path configuration comprises arranging the DRAM data path responsive to a register read command issued to the DRAM device.

22. A dynamic random access memory (DRAM) device, comprising circuitry configured to:
arrange a data path in the DRAM device based on a first data path configuration for memory operations where maintaining data bit order between the DRAM device and a chip carrier is required, the first data path configuration configured to at least partially maintain data bit order between the DRAM device and the chip carrier; and
arrange the DRAM data path based on a different data path configuration for memory operations where maintaining data bit order between the DRAM device and the chip carrier is not required.

23. The DRAM device of claim 22, wherein the circuitry is configured to arrange the DRAM data path based on one or more bits stored in a register.

24. The DRAM device of claim 22, wherein the circuitry is configured to arrange the DRAM data path based on one or more sensed voltage levels.

25. The DRAM device of claim 24, wherein the circuitry is configured to store a voltage level sensed at one or more terminal pads of the DRAM device during reset of the DRAM device and arrange the DRAM data path based on each stored voltage level.

26. The DRAM device of claim 24, wherein the circuitry is configured to arrange the DRAM data path based on a voltage level sensed at one or more terminal pads of the DRAM device dedicated to indicating the data path configuration.

27. The DRAM device of claim 22, wherein the circuitry is configured to arrange the DRAM data path responsive to a register read command issued to the DRAM device.

* * * * *